Oct. 31, 1961 D. Q. FULLER 3,007,091
HIGH FREQUENCY TRANSISTOR
Filed Sept. 5, 1958
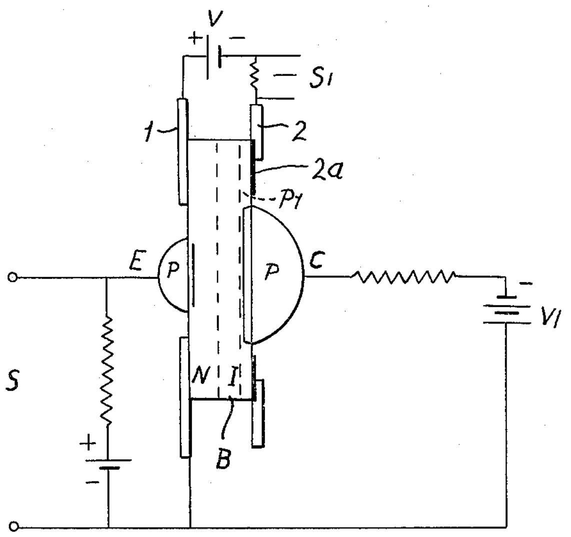
Inventor
Dennis Q. Fuller
By Holcombe, Wetherill & Brisebois
Attorneys United States Patent Office 3,007,091

Patented Oct. 31, 1961

3,007,091

HIGH FREQUENCY TRANSISTOR

Dennis Q. Fuller, Cambridge, England, assignor to Pye Limited, Cambridge, England, a British company Filed Sept. 5, 1958, Ser. No. 759,195
Claims priority, application Great Britain Sept. 10, 1957
4 Claims. (Cl. 317—235)

The present invention relates to transistors, particularly PNIP, NPIN or graded base transistors, and other transistors having a built-in accelerating field region in the base.

Such transistors normally have a washer-like base connection electrode on that face of the base wafer which carries the emitter. According to this invention an additional electrode is connected to the opposite face of the base wafer so that a biasing potential can be applied between the base electrode and additional electrode with such polarity that the minority carriers are accelerated towards the collector.

According to a feature of the invention, the additional electrode is brought as near as practicable to the actual transistor junction without coming into direct electrical contact therewith, the electrode being in close electrical contact with the base itself over the intrinsic region.

Referring to the accompanying drawing, which shows a PNIP transistor according to the invention, E is the emitter and C the collector on opposite faces of the base wafer B. 1 is the usual base electrode and 2 is an additional washer-like accelerating or hook electrode on the opposite face of the base. The electrode 2 may include a metal film *2a* evaporated on to the surface of the base and reaching almost to the collector junction but not over it. A voltage V is applied across the electrodes 1 and 2, with the positive pole connected to the electrode 1. This voltage will accelerate carriers towards the collector. The voltage V can be much greater than the voltage $V_1$ applied to the collector.

When V is large, a space charge (i.e. trapped holes) will be created near the collector junction, and a signal current $S_1$ applied to the accelerating electrode 2 will control the current to the collector from the immediate vicinity of the junction, thus enabling very high frequency response.

It may be advantageous to create a slightly P type region, labelled P1 in the drawing, in the area under the collector electrode and extending to electrode 2. Such a region provides an area of substantial conductivity so as to encourage current to flow over as large a portion of the transistor as possible as a result of the influence of the potential V.

It is possible that under some conditions an alpha (grounded base amplification) greater than unity can be produced, thus combining the merits of point contact with the reliability of junction transistors. This effect could be applied to correcting beta fall-off of any junction transistor.

The invention provides a junction transistor with an accelerating field in the base region. This will ensure an improved frequency performance and current gain characteristics. It also enables a signal to be impressed on it via the additional electrode 2, thereby enabling the transistor to be used as a mixing device.

I claim:

1. A transistor comprising a base wafer of semiconductor material whose conductivity characteristic varies from one face to the other face and including an intrinsic region adjacent the other face, an emitter on said one face of the wafer, a collector on the opposite face of the wafer in the intrinsic region, a first annular base electrode attached to said one face of the wafer and surrounding the emitter, a second annular base electrode attached to the other face of the wafer and surrounding the collector, and a metal film extending over the other face from the second base electrode to closely adjacent the collector without coming into direct electrical contact therewith.

2. A transistor comprising a base wafer of semiconductor material whose conductivity characteristic varies from one face to the other face, an emitter in the centre of said one face of the wafer, a collector in the centre of said other face of the wafer and opposite said emitter, a first annular base electrode attached to one face of the wafer and surrounding the emitter and a second annular base electrode attached to the other face of the wafer and closely surrounding the collector and including a metal layer extending to closely adjacent the collector without coming into direct electrical contact therewith.

3. A transistor comprising a base wafer of semiconductor material having an N-type region adjacent one face and an intrinsic region adjacent the other face, a P-type emitter on said one face of the wafer, a P-type collector on the opposite face of the wafer in the intrinsic region, a first annular base electrode attached to one face of the wafer and surrounding the emitter, and a second annular base electrode attached to the other face of the wafer and closely surrounding the collector and including a metal layer extending to closely adjacent the collector without coming into direct electrical contact therewith.

4. A transistor as claimed in claim 3, in which a P-type conductive region is formed in the intrinsic region in the area under the collector and extending to the second annular base electrode.

References Cited in the file of this patent

UNITED STATES PATENTS

| | | |
|---|---|---|
| 2,801,348 | Pankove | July 30, 1957 |
| 2,842,668 | Rutz | July 8, 1958 |
| 2,847,583 | Lin | Aug. 12, 1958 |
| 2,851,594 | Herold | Sept. 9, 1958 |
| 2,857,527 | Pankove | Oct. 21, 1958 |
| 2,900,531 | Wallmark | Aug. 18, 1959 |